United States Patent [19]

Lent et al.

[11] Patent Number: 5,270,368
[45] Date of Patent: Dec. 14, 1993

[54] ETCH-RESISTANT JET INK AND PROCESS

[75] Inventors: Bruce A. Lent, Oak Park; Nikolay Shevelev, River Forest, both of Ill.

[73] Assignee: Videojet Systems International, Inc., Wood Dale, Ill.

[21] Appl. No.: 914,477

[22] Filed: Jul. 15, 1992

[51] Int. Cl.$^5$ .............................................. C08L 75/04
[52] U.S. Cl. .................... 524/236; 524/401; 524/82; 524/340; 524/365; 524/379; 525/221
[58] Field of Search ................ 524/236, 401, 82, 340, 524/365, 379; 525/221

[56] References Cited

U.S. PATENT DOCUMENTS

| | | | |
|---|---|---|---|
| 3,060,429 | 10/1962 | Winston | 346/1 |
| 3,298,030 | 1/1967 | Lewis et al. | 346/75 |
| 3,373,437 | 3/1968 | Sweet et al. | 346/75 |
| 3,416,153 | 12/1968 | Hertz et al. | 346/75 |
| 3,673,601 | 6/1972 | Hertz | 346/75 |
| 4,668,533 | 5/1987 | Miller | 427/98 |

FOREIGN PATENT DOCUMENTS 3047884 7/1982 Fed. Rep. of Germany .
56-66089 6/1981 Japan .

OTHER PUBLICATIONS

Keeling, *Phys. Technol*, 12(5), 196–303 (1981).
Kuhn et al., *Scientific American*, Apr. 1979, 162–168.
Vest et al., "Ink Jet Printing of Hybrid Circuits", Int'l J. Hybrid Microelectronics, 6, pp. 261–267 (1983).

*Primary Examiner*—Maurice J. Welsh
*Attorney, Agent, or Firm*—Leydig, Voit & Mayer, Ltd.

[57] ABSTRACT

A UV curable, etch-resistant ink composition for ink jet printing of variable information on printed circuit boards and for printing the circuit boards themselves comprising a resin formulation having at least two acrylate components, one of which is an acrylate having a pendant carboxyl group and one of which is an acrylated epoxy monomer or dimer, a photoinitiator and an organic carrier. Also, methods for printing variable information on printed circuit boards and for printing the circuit boards themselves utilizing a UV curable, etch-resistant ink composition.

41 Claims, No Drawings

ETCH-RESISTANT JET INK AND PROCESS

TECHNICAL FIELD OF THE INVENTION

The present invention is directed to an etch-resistant ink composition for printing on circuit boards and a method of printing variable information, or the circuit itself, on a metal substrate, with an ink jet printer.

BACKGROUND OF THE INVENTION

In the past, a screen printing method was prevalently adopted for forming resist patterns on printed circuit boards. The screen printing technique involves squeezing a composition through the open meshes of a stretched piece of material such as wire onto a printable substrate. The screen is covered or blocked out in part by a masking material in order to form the desired pattern on the printable substrate. The masking material may simply be a stencil or a dried lacquer, shellac or glue. Once the screen has been covered or blocked out in part by a masking material, it is held taut on a frame and positioned over the desired substrate. A composition is then poured onto the screen and squeezed through the open areas, as with a squeegee. It is important, when following a desired pattern, that the composition does not flow or bleed outside of the preselected areas defined by the open areas of the screen, but should follow accurately the image formed on the screen and reproduce it.

The screen printing method by nature has low resolution. When screen printing is carried out with a screen printing ink of relatively high viscosity, such adverse phenomena as breaks, screen marks, and pinholes occur in the produced patterns. When screen printing is carried out with a screen printing ink of relatively low viscosity, such adverse phenomena as bleeds, smudges and sags ensue. Because of these defects, screen printing can no longer keep abreast with the recent trend of printed circuit boards toward increasing density.

Printed circuit boards have also been prepared by a process which comprises applying copper plating onto a copper foil plated, laminated plate, laminating thereonto a photosensitive film, exposing the photosensitive film to light through a photographic negative, and removing the unexposed portion, followed by etching away any unnecessary copper foil part not under a circuit pattern, and by removing the photosensitive film to form a printed circuit on the insulated laminated plate. The photosensitive film used in this process raises the problem that the circuit pattern formed by exposing to light and developing is not sharp because the film is so thick, normally in the neighborhood of 50 $\mu$m, that it is difficult to uniformly laminate the photosensitive film on the surface of the copper foil. The photosensitive film is mostly removed uselessly in spite of being expensive.

Further, variable information such as production date, lot number, batch number, serial number, and the like, are presently placed on individual circuit boards by hand, using so-called legend inks.

Ink jet printing and ink compositions which permit ink to be jetted from an ink jet printer offer a means for preparing circuit boards of increasing density and printing variable information or a circuit board. Ink jet printing is a non-impact technique for projecting droplets of ink onto a substrate. There are two major categories of ink jet printing, "Drop-On-Demand" ink jet and "Continuous" ink jet. Using Drop-On-Demand ink jet technology, the ink is normally stored in a reservoir and delivered to a nozzle in the print head of the printer. A means exists to force a single drop of ink out of the nozzle whenever it is needed to print a single spot on the printed medium (for example, paper). For Continuous ink jet, a conducting ink is supplied under pressure to an ink nozzle and forced out through a small orifice, typically 35 to 80 $\mu$m in diameter. Prior to passing out of the nozzle, the pressurized ink stream proceeds through a ceramic crystal which is subjected to an electric current. This current causes a piezoelectric vibration equal to the frequency of the AC electric current. This vibration, in turn, generates the ink droplets from the unbroken ink stream. The ink stream breaks up into a continuous series of drops which are equally spaced and of equal size. Surrounding the jet, at the point where the drops separate from the liquid stream in a charge electrode, a voltage is applied between the charge electrode and the drop stream. When the drops break off from the stream each drop carries a charge proportional to the applied voltage at the instant at which it breaks off. By varying the charge electrode voltages at the same rate as drops are produced it is possible to charge every drop to a predetermined level. The drop stream continues its flight and passes between two deflector plates which are maintained at a constant potential, typically $+/- 2.5$ kV. In the presence of this field, a drop is deflected towards one of the plates by an amount proportional to the charge carried. Drops which are uncharged are undeflected and collected into a gutter to be recycled to the ink nozzle. Those drops which are charged, and hence deflected, impinge on a substrate traveling at a high speed at right angles to the direction of drop deflection. By varying the charge on individual drops, the desired pattern can be printed.

The ink jet process is adaptable to computer control for high speed printing of continuously variable data. Ink jet printing methods can be divided into three general categories: high pressure, low pressure and vacuum techniques. All have been described and employed in conventional ink jet printing and can be employed in the present invention.

Reviews of various aspects of conventional ink jet printing can be found in these publications: Kuhn et al., *Scientific American*, April, 1979, 162–178 and Keeling, *Phys. Technol.*, 12(5), 196–303 (1982). Various ink jet apparatuses are described in U.S. Pat. No. 3,060,429, U.S. Pat. No. 3,298,030, U.S. Pat. No. 3,373,437, U.S. Pat. No. 3,416,153 and U.S. Patent No. 3,673,601.

German Patent Specification No. 3,047,884 discloses the preparation of printed circuit boards employing an ink jet printer. Also disclosed is the spraying of organometallic solutions such as organocopper compounds directly onto an unmetallized circuit board. By means of a subsequent laser beam, the conductor pathways can be cured completely.

Vest et al., *Int'l J. Hybrid Microelectronics*, 6, 261–267 (1983), discloses computer controlled ink jet printing of hybrid microelectronics circuits. An ink jet printer is used with a conductor ink based on metallo-organic compounds in solution. The use of silver neodecanoate as a silver conductor is disclosed, with or without added platinum in the form of platinum amine octoate, to produce a solderable connector. Silver conductor line patterns on glass and alumina substrates were produced, the silver inks decomposed to silver when heated to 250° C.

U.S. Pat. No. 4,668,533 discloses the preparation of printed circuit boards using an ink jet printer by depositing a water-based ink which contains a metal on a substrate in a predetermined pattern, followed by the depositing of a second metal to the same substrate congruent to the first metal.

Japanese KoKai No. 66089/1981 discloses a printed circuit board obtained by ink jet printing onto a copper clad plastic substrate, an acid-proof ink containing a material such as silicon varnish which solidifies on drying, and etching the undesired portion of the copper foil. The silicon varnish has several disadvantages. The silicon varnish is sensitive to hydrolysis by water in a humid environment which would result in an ink having different properties than it did prior to hydrolysis. Further, as a solvent based system, the printed message dries quickly preventing any changes from being made. In contrast, the ink composition of the present invention is not set until it is exposed to UV light. Therefore, changes can easily be made by wiping off the uncured message with a dry towel and printing again.

A need therefore exists for a UV curable, etch-resistant ink composition capable of being jetted from an ink jet printer onto a metal or ceramic substrate that does not suffer from the drawbacks of the silicon varnish ink. A further need exists for a method for applying variable information to a printed circuit board. The foregoing and other needs are satisfied by the present invention and will be apparent from the description of the invention provided herein.

SUMMARY OF THE INVENTION

The present invention provides a UV curable, etch-resistant ink composition for use in ink jet applications, particularly for printing variable information on printed circuit boards or for printing the printed circuit boards themselves. The composition contains a resin formulation of at least two acrylate resins, one of which is an acrylate resin containing at least one carboxyl group and one of which is an acrylated epoxy monomer or dimer. The resin formulation may contain additional components such as adhesion promoting acrylate resins, viscosity lowering acrylate resins, cross linking enhancing acrylate resins, acrylate resins capable of promoting chemical resistance, and acrylate resins having fast curing properties. The composition also contains a photoinitiator and an organic carrier. The ink composition may contain additional components such as conductivity agents, surfactants, photosensitizers, and photostabilizers. The ink composition may be used in an ink jet printer to print variable information on printed circuit boards or to print the circuit boards themselves.

DETAILED DESCRIPTION OF THE INVENTION

The invention may best be understood in the following detailed description.

The UV curable, etch-resistant ink composition is comprised of a resin formulation of two or more resin components. A first resin component is an acrylated epoxy monomer or dimer. A second resin component is an acrylate having a pendant carboxyl group. In addition to the resins, the ink composition also consists of a photoinitiator and an organic carrier.

The acrylated epoxy monomer or dimer is used as a film former and should provide excellent adhesion to the metal substrate. Without such a component, the ink composition will have noticeably poorer chemical resistance during etching.

The acrylated monomers and dimers may be present in the ink compositions in an amount ranging from about 5% to about 20%, preferably about 10% to about 15%, based on the total weight of the ink composition.

Preferred is a low viscosity, non-volatile, difunctional ester from a low molecular weight epoxy resin, such as Bisphenol A epoxy diacrylate marketed by Henkel under the trademark Photomer 305.

The acrylate having a pendant carboxyl group provides the cured ink with the ability to be stripped from the printed circuit board after the etching process has been completed. Without this resin, the etched message cannot be easily stripped off the substrate, as by use of a basic solution.

The acrylate having a pendant carboxyl group may be present in the ink in a amount ranging from about 8% to about 43%, preferably from about 14% to about 20%, based on the total weight of the ink composition.

The acrylates having pendant carboxyl groups which may be employed in the compositions of the present invention include aromatic difunctional acrylates (Henkel's Photomer 6158).

The preferred acrylate having a pendant carboxyl group is the aromatic acrylate such as that marketed by Henkel under the trademark Photomer 6173.

The resin formulation may contain additional resin components. It may contain a resin component or components to promote adhesion, particularly to metal substrates. The amount of such an adhesion promoter may range from about 3% to about 10%, but is preferably about 3% to about 5%, based on the total weight of the ink composition. Nonyl phenol ethoxylate monoacrylate marketed by Henkel under the trademark Photomer 4003 and Bisphenol A ethoxylate diacrylate marketed by Henkel under the trademark Photomer 4028 are preferred resins.

The resin formulation may also contain resin components which contribute to an improved chemical resistance. The amount of such resin in the composition of the present invention is in a range of about 2% to about 10%, preferably about 4% to about 6%, based on the total weight of the ink composition. Preferred resins are Bisphenol A ethoxylate diacrylate marketed by Henkel under the trademark Photomer 4028 and trimethylol propane propoxylate triacrylate marketed by Henkel under the trademark Photomer 4072.

Other useful resins include those which lower the viscosity of the composition of the present invention. Such resins include 1,6 hexanediol diacrylate (marketed by Radcure).

Preferable resins for lowering viscosity include ethoxylated neopentyl glycol diacrylate marketed by Henkel under the trademark Photomer 4160 and trimethylol propane triacrylate marketed by Radcure.

These viscosity lowering resins are effective when the total amount in the ink composition is from about 10% to about 25%, preferably from about 11% to about 15%, based on the total weight of the ink composition.

The resin formulation may also contain resins which have fast curing properties to provide a quicker cure speed to the ink composition of the present invention. Preferable resins include ethoxylated neopentyl glycol diacrylate marketed by Henkel under the trademark Photomer 4160 and Bisphenol A ethoxylate diacrylate marketed by Henkel under the trademark Photomer 4028.

Effective amounts of these resins range from about 5% to about 15%, preferably from about 1% to about 10%, based on the total weight of the ink composition.

Other useful resins which may be used in the resin formulation are those which provide enhanced cross linking. Such resins include 1,4-butanediol diacrylate, 1,4-butanediol dimethacrylate, 1,6-hexamethylene glycol diacrylate, 1,6-hexamethylene dimethacrylate, neopentyl glycol diacrylate, neopentyl glycol dimethacrylate, trimethylol propane triacrylate, trimethylol propane trimethacrylate, pentaerythritol triacrylate, pentaerythritol trimethacrylate, pentaerythritol tetraacrylate, pentaerythritol tetramethacrylate, dipentaerythritol hexaacrylate, dipentaerythritol hexamethacrylate, triethylene glycol triacrylate, triethylene glycol trimethacrylate, urethane acrylate, urethane methacrylates, Preferred resins which provide enhanced cross linking are trimethylol propane triacrylate marketed by Radcure, ethoxylated neopentyl glycol diacrylate marketed by Henkel under the trademark Photomer 4160 and trimethylol propane propoxylate triacrylate marketed by Henkel under the trademark Photo 4072.

These cross linking enhancing resins are effective in amounts ranging from about 10% to about 20%, preferably from about 12% to about 16%, based on the total weight of the ink composition.

Trimethylol propane propoxylate triacrylate marketed by Henkel as Photomer 4072 is preferred for improving abrasion resistance.

Resins providing abrasion resistance may be present in the composition of the present invention in amounts ranging from about 1% to about 5%, preferably from about 1% to about 2%.

The compositions of the present invention also contain a photoinitiator. Many such materials are well known to the prior art. The photoinitiator can be any compound that produces a free radical on exposure to radiation such as ultraviolet or visible radiation and thereby initiates a polymerization reaction. Examples of some suitable photoinitiators include anthraquinone and substituted anthraquinones such as alkyl substituted or halo substituted anthraquinones including 2-tert-butylanthraquinone, 1-chloro-anthraquinone, p-chloroanthraquinone, 2-methylanthraquinone, 2-ethylanthraquinone, octamethylanthraquinone and 2-amylanthraquinone; other substituted or unsubstituted polynuclear quinones including 1,4-naphthoquinone, 9,10-phenanthraquinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, 3-chloro-2-methylanthraquinone, retenequinone, 7,8,9,10-tetra-hydronaphthaacenequinone, 1,2,3,4-tetrahydrobenzantracene-7,2-dione; acetophones such as acetophone, 2,2-dimethoxy-2-phenylacetophone, 2,2-diethoxy-2-phenylacetophone, 1,1-dichloroacetophone, 1-hydroxycyclohexylphenylketone, and 2-methyl-1-(4-methylthio)phenyl-2-morpholin-propan-1-one; thioxanthones such as 2-methylthioxanthone, 2-decylthioxanthone, 2-dodecylthioxanthone (DTX), 2-isopropylthioxanthone, 2,4-dimethythioxanthone, 2,4-diethylthioxanthone, 2-chlorothioxanthone, and 2,4-diisopropylthioxanthone; and ketals such as acetophone dimethylketal and benzil dimethylketal; benzoins and benzoin alkyl ethers such as benzoin, benzyl, benzoin methyl ether, and benzoin isopropyl ether, and benzoin isobutyl ether (also known as vicure 10); azo compounds such as azobisisovaleronitrile; and benzophones such as benzophenone, methyl benzophenone, 4,4'-dichlorobenzophenone, 4,4'-bisdiethylaminobenzophenone, Michler's ketone and xanthones. Mixtures of photoinitiators can be employed when desired. The preferred photoinitiator is marketed by Ciba-Geigy under the trademark Irgacure 369 and is chemically 2-benzyl-2-N,N-dimethylamino-1-(4-morpholinophenyl)-1-butanone.

The photoinitiator is present in the ink composition in an amount ranging from about 2% to about 10%, preferably about 2% to about 3%.

The compositions of the present invention also utilize one or more organic carriers. One typical carrier is a mixture of a lower alcohol and a lower ketone, each preferably having no more than ten carbon atoms. Alcohols which typify those which are useful are methanol and ethanol. Useful ketones in the present invention include aliphatic ketones having no more than ten carbon atoms, in straight or branched chain arrangement, such as acetone, methyl ethyl ketone, methyl isobutyl ketone, or an alicyclic ketone such as cyclopentanone, cyclohexanone, or other alicyclic ketones having up to ten carbon atoms. The preferred organic carrier is a mixture of methanol and methyl ethyl ketone.

The carrier employed usually is in the range of about 40% to about 90% by weight of the ink composition, and in the preferred practice is in the range of about 30% to about 60% by weight of the ink composition.

The compositions of the present invention may also contain conductivity agents. If present, they are present in amounts of from about 0.2% to about 2.0%. Examples of suitable conductivity agents include dimethylamine hydrochloride, diethylamine hydrochloride, lithium nitrate, and hydroxylamine hydrochloride. The preferred conductivity agent is lithium nitrate.

Surfactants may also be used in the ink compositions of the present invention to modify the surface tension of the compositions. If present, they may be present in the ink composition in amounts of from about 0.01% to about 0.2%. The preferred surfactant is a non-ionic surfactant such as fluorinated alkyl esters like FC-430, a surfactant from 3M.

The compositions of the present invention may also include photosensitizers. The photosensitizers increase sensitivity by absorbing light of the wavelengths to which it best responds. Many such materials are well known to the prior art. If present, they are present in amounts ranging from about 0.25% to about 5%. Examples of some suitable photosensitizers include all of the photoinitiators mentioned above; halogen-type sensitizers such as carbontetrachloride, bromoform and carbontribromide; benzoic esters such as ethyl-4-dimethylaminobenzoate and 2-(dimethylamino)ethylbenzoate; tertiary amines such as triethyl amine and triethanol amine; benzotriazole, benzoin, chloranil, benzil, diacetyl, 5-nitrosalicylaldehyde, 2,4-dinitrotoluene. The preferred photosensitizer is 2-isopropylthioxanthone sold by Biddle Sawyer under the trademark Quantacure ITX.

Photostabilizers may also be employed in the compositions of the present invention to prevent polymerization of the compositions when exposed to natural light. They may be present in the ink composition in amounts ranging from about 0.01% to about 0.1%. The preferred photostabilizer is p-methoxyphenol.

The ink composition of the present invention may contain a corrosion inhibitor in sufficient quantity to inhibit corrosion of metal placed in contact with the ink, without adversely affecting the printing characteristics of the ink.

Suitable corrosion inhibitors include from 0.5% to 5% of an essentially basic, heat-stable, metallo-organic sulphonate compound. The sulphonate compound may be selected from the group consisting of ammonium dinonyl naphthalene sulphonate, basic barium dinonyl naphthalene sulphonate, neutral barium dinonyl naphthalene sulphonate, ethylene diamine dinonyl naphthalene sulphonate, basic barium sulphonate naphthalene sulphonate, overbased sulphurized calcium alkyl phenate, basic calcium sulphonate, overbased calcium sulphonate and highly overbased calcium sulphonate. In addition, suitable corrosion inhibitors may be from 0.1% to 5% of an alkyl amine. Typical examples of alkylamines are dipropyl amine, diethylamine and dibutyl amine.

The present invention may also comprise other additives, which may be any substance that can enhance the ink with regard to (i) improved solubility of other components, (ii) improved print quality, (iii) improved adhesion of the ink to the media, and (iv) control of wetting characteristics, which may be related to such properties as surface tension and viscosity, among other properties.

In addition, other optional additives such as dispersing agents may be present. If present, they may be present in the ink in amounts of from about 0.01 to about 20 percent by weight. Further, plasticizers such as pentaerythritol tetrabenzoate, commercially available as Benzoflex S552 (Velsicol Chemical Corporation, Chicago, Ill.), trimethyl citrate, commercially available as Citroflex 1 (Monflex Chemical Company, Greensboro, N.C.), N,N-dimethyl oleamide, commercially available as Halcomid M-18-OL (C. P. Hall Company, Chicago, Ill.), and the like, may be present.

The ink of this invention can be used as a clear ink without the addition of a colorant. If the ink is desired to be visible (for example, to make sure this ink after curing and etching was completely stripped) colorants can be added. Typically, if colorants are present in the ink, they are used in an amount ranging from about 0.5% to 4%, preferably about 1% to about 3%. Colorants which may be employed in the present invention include Morfast black A, Morfast black 101, Morfast red 102, and Morfast yellow 102. The above dyes are available from Morton International. Also, Hektoblack X-2 (from BASF) can be used. In addition, Milliken Chemicals offers Milliken blue A45-1, Milliken red A45-2, and Milliken yellow A45-3. The preferable colorant for the present invention is the Milliken red A45-2.

While not essential to the practice of the present invention, the ink composition of this invention can also be formulated to include evaporation retardants, also known as humectants. These compounds prevent the ink jet orifice from drying or crusting. Typical classes of humectants include glycol ethers and glycol esters or combinations thereof. Specific examples are compounds such as ethylene glycol and propylene glycol methyl ether.

The formulated jet inks of the present invention will exhibit the following characteristics: (1) a viscosity from about 1 to about 10 centipoises (cps) at 25° C., (2) an electrical resistivity from about 50 to about 2,000 ohms-cm.$^{-1}$, (3) a sonic velocity from about 1,200 to about 1,700 m/sec., and (4) a surface tension below 28 dynes/cm. Electrolytes can be added to adjust the specific resistivity of the ink. Usable electrolytes include dimethylamine hydrochloride and hydroxylamine hydrochloride. The modifications of the principal components of the ink compositions, as disclosed above, to achieve these desired operational characteristics is well within the skill in the art.

The viscosity of the jet ink composition is generally from about 1 to about 10 centipoise, and preferably from about 2 to about 5 centipoise. Various, known viscosity modifying agents may be added, in addition to any acrylate resins capable of lowering viscosity, as needed to adjust the viscosity of any given ink formulation. Additionally, the jet ink composition should enable printed images with sufficient flexibility to prevent cracking or creasing.

The compositions of this invention can be applied to a wide range of non-porous substrates, e.g. coated paper, metal, wood, metals, ceramics, plastics or glass. However, the invention is of especial use in forming a pattern on a copper clad board, such as variable information or the circuit itself, and then etching the board to obtain the variable information or printed circuit.

The ink composition of the present invention may be employed as in the ink jet process disclosed in U.S. Pat. No. 4,668,533.

The following examples further illustrate the ink compositions of the present invention, but of course, should not be construed as in any way limiting its scope.

EXAMPLE I

The following composition was formulated:

| | |
|---|---|
| Bisphenol A Epoxy Diacrylate (Henkel's Photomer 3015) | 10.30% by weight |
| Nonyl Phenol Ethoxylate Monoacrylate (Henkel's Photomer 4003) | 1.40% by weight |
| Bisphenol A Ethoxylate Diacrylate (Henkel's Photomer 4028) | 3.40% by weight |
| Trimethylol Propane Propoxylate Triacrylate (Henkel's Photomer 4072) | 1.00% by weight |
| Ethoxylated Neopentyl Glycol Diacrylate (Henkel's Photomer 4160) | 5.10% by weight |
| Aromatic Monofunctional Acrylate (Henkel's Photomer 6173) | 14.80% by weight |
| Trimethylol Propane Triacrylate (Radcure) | 5.10% by weight |
| Methanol | 52.96% by weight |
| Methyl Ethyl Ketone | 2.55% by weight |
| Irgacure 369 | 2.00% by weight |
| Lithium Nitrate | 0.30% by weight |
| FC-430 | 0.05% by weight |
| Quantacure ITX | 1.00% by weight |
| p-methoxyphenol | 0.04% by weight |
| | 100.00% by weight |

The resulting ink composition had a viscosity of 2.31 cps, a conductivity of 990 ohm-cm$^{-1}$, and produced an unbroken copper line after etching. The copper line was found to be able to carry a current.

EXAMPLE II

The following composition was formulated:

| | |
|---|---|
| Bisphenol A Epoxy Diacrylate (Henkel's Photomer 3015) | 10.90% by weight |
| Nonyl Phenol Ethoxylate Monoacrylate (Henkel's Photomer 4003) | 1.50% by weight |
| Bisphenol A Ethoxylate Diacrylate (Henkel's Photomer 4028) | 3.20% by weight |
| Trimethylol Propane Propoxylate | 1.10% by weight |

-continued

| | |
|---|---|
| Triacrylate (Henkel's Photomer 4072) | |
| Ethoxylated Neopentyl Glycol Diacrylate (Henkel's Photomer 4160) | 5.40% by weight |
| Aromatic Monofunctional Acrylate (Henkel's Photomer 6173) | 15.60% by weight |
| Trimethylol Propane Triacrylate (Radcure) | 5.40% by weight |
| Methanol | 47.86% by weight |
| Methyl Ethyl Ketone | 2.65% by weight |
| Vicure 10 | 4.00% by weight |
| Lithium Nitrate | 0.30% by weight |
| FC-430 | 0.05% by weight |
| Hektoblack-X-21 | 2.00% by weight |
| p-methoxyphenol | 0.04% by weight |
| | 100.00% by weight |

Black ink; Visc = 2.93 cps; Res. = 649 ohm-cm$^{-1}$

EXAMPLE III

The following composition was formulated:

| | |
|---|---|
| Bisphenol A Epoxy Diacrylate (Henkel's Photomer 3015) | 12.00% by weight |
| Nonyl Phenol Ethoxylate Monoacrylate (Henkel's Photomer 4003) | 1.50% by weight |
| Bisphenol A Ethoxylate Diacrylate (Henkel's Photomer 4028) | 3.40% by weight |
| Trimethylol Propane Propoxylate Triacrylate (Henkel's Photomer 4072) | 1.20% by weight |
| Ethoxylated Neopentyl Glycol Diacrylate (Henkel's Photomer 4160) | 5.80% by weight |
| Aromatic Monofunctional Acrylate (Henkel's Photomer 6173) | 16.90% by weight |
| Trimethylol Propane Triacrylate (Radcure) | 5.80% by weight |
| Methanol | 46.56% by weight |
| Methyl Ethyl Ketone | 0.45% by weight |
| Irgacure 369 | 2.00% by weight |
| Lithium Nitrate | 0.30% by weight |
| FC-430 | 0.05% by weight |
| Quantacure ITX | 1.00% by weight |
| p-methoxyphenol | 0.04% by weight |
| Milliken Blue A45-1 | 1.04% by weight |
| Milliken Red A45-2 | 0.96% by weight |
| Milliken Yellow A45-3 | 1.00% by weight |
| | 100.00% by weight |

Visc = 3.58 cps; Res. = 1,138 ohm-cm$^{-1}$; Color - black

EXAMPLE IV

The following composition was formulated:

| | |
|---|---|
| Bisphenol A Epoxy Diacrylate (Henkel's Photomer 3015) | 12.00% by weight |
| Nonyl Phenol Ethoxylate Monoacrylate (Henkel's Photomer 4003) | 1.50% by weight |
| Bisphenol A Ethoxylate Diacrylate (Henkel's Photomer 4028) | 3.40% by weight |
| Trimethylol Propane Propoxylate Triacrylate (Henkel's Photomer 4072) | 1.20% by weight |
| Ethoxylated Neopentyl Glycol Diacrylate (Henkel's Photomer 4160) | 5.80% by weight |
| Aromatic Monofunctional Acrylate (Henkel's Photomer 6173) | 16.90% by weight |
| Trimethylol Propane Triacrylate (Radcure) | 5.80% by weight |
| Methanol | 47.56% by weight |
| Methyl Ethyl Ketone | 0.45% by weight |
| Irgacure 369 | 2.00% by weight |
| Lithium Nitrate | 0.30% by weight |
| FC-430 | 0.05% by weight |
| Quantacure ITX | 1.00% by weight |
| p-methoxyphenol | 0.04% by weight |
| Morfast Ink Black A | 2.00% by weight |
| | 100.00% by weight |

Black ink; Visc. = 3.21 cps; Res = 904 ohm-cm$^{-1}$

All of the references cited herein are hereby incorporated in their entireties by reference.

While this invention has been described with an emphasis upon a preferred embodiment, it will be obvious to those of ordinary skill in the art that variations in the preferred composition and method may be used and that it is intended that the invention may be practiced otherwise than as specifically described herein. Accordingly, this invention includes all modifications encompassed within the spirit and scope of the invention as defined by the following claims.

What is claimed is:

1. An ink composition for use in ink jet printing comprising:
   a. a resin composition comprising at least two acrylate resin components, a first acrylate resin component being an aromatic acrylate resin that contains at least one pendant carboxyl group and a second resin acrylate component being an acrylated epoxy monomer or dimer;
   b. a photoinitiator; and
   c. an organic carrier.

2. The composition according to claim further comprising a conductivity agent.

3. The composition according to claim 2, wherein said conductivity agent is selected from the group consisting of lithium nitrate, dimethylamine hydrochloride and hydroxylamine hydrochloride.

4. The composition according to claim 2, wherein said conductivity agent is lithium nitrate.

5. The composition according to claim 1, further comprising a surfactant capable of modifying the surface tension of said ink composition.

6. The composition according to claim 5, wherein said surfactant is a fluorinated alkyl ester.

7. The composition according to claim further comprising a photosensitizer.

8. The composition according to claim 7, wherein said photosensitizer is an isopropylthioxanthone.

9. The composition according to claim 1, further comprising a photostabilizer.

10. The composition according to claim 9, wherein said photostabilizer is p-methoxyphenol.

11. The composition according to claim 1, wherein said resin composition further comprises at least one adhesion promoting acrylate resin capable of promoting adhesion to metal substrates.

12. The composition according to claim 11, wherein said adhesion promoting acrylic resin is selected from the group of nonyl phenol ethoxylate monoacrylate, and Bisphenol A ethoxylate diacrylate.

13. The composition according to claim 11, wherein said adhesion promoting acrylate resin is nonyl phenol ethoxylate monoacrylate.

14. The composition according to claim wherein said resin composition further comprises at least one acrylate resin capable of providing chemical resistance to said ink composition.

15. The composition according to claim 14, wherein said acrylate resin capable of providing chemical resistance is selected from the group of Bisphenol A ethoxylate diacrylate, trimethylol propane propoxylate triacrylate.

16. The composition according to claim 14, wherein said acrylate resin capable of providing chemical resistance is Bisphenol A ethoxylate diacrylate.

17. The composition according to claim 1, further comprising at least one viscosity lowering acrylate resin capable of lowering the viscosity of said ink composition.

18. The composition according to claim 17, wherein said viscosity lowering acrylate resin is selected from the group of trimethylol propane propoxylate triacrylate, ethoxylated neopentyl glycol diacrylate, trimethylol propane triacrylate, 1,6-hexanediol diacrylate.

19. The composition according to claim 17, wherein said viscosity lowering acrylate resin is trimethylol propane propoxylate triacrylate.

20. The composition according to claim 17, wherein said viscosity lowering acrylate is ethoxylated neopentyl glycol diacrylate.

21. The composition according to claim 17, wherein said viscosity lowering acrylate is trimethylol propane triacrylate.

22. The composition according to claim 1, wherein said resin composition further comprises at least one acrylate resin having fast curing properties.

23. The composition according to claim 22, wherein said acrylate resin is selected from the group of ethoxylated neopentyl glycol diacrylate and Bisphenol A ethoxylate diacrylate.

24. The composition according to claim 22, wherein said acrylate resin is ethoxylated neopentyl glycol diacrylate.

25. The composition according to claim 1, wherein said resin composition further comprises at least one cross linking enhancing acrylate resin.

26. The composition according to claim 25, wherein said cross linking enhancing acrylate resin is selected from the group of trimethylol propane triacrylate and ethoxylated neopentyl glycol diacrylate.

27. The composition according to claim 25, wherein said cross linking enhancing acrylate resin is trimethylol propane triacrylate.

28. The composition according to claim 1, wherein said resin composition further comprises at least one acrylate resin capable of providing abrasion resistance.

29. The composition according to claim 28, wherein said acrylate resin capable of providing abrasion resistance is trimethylol propane propoxylate triacrylate.

30. The composition according to claim 1, wherein said first acrylate resin component is Bisphenol A epoxy diacrylate.

31. The composition according to claim 1, wherein said second acrylate resin component is an aromatic acrylate which contains at least one pendant carboxyl group.

32. The composition according to claim 1, wherein said second acrylate resin component is selected from the group of aromatic monofunctional acrylates, aromatic difunctional acrylates.

33. The composition according to claim 32, wherein said second acrylate resin component is an aromatic monofunctionalacrylate.

34. The composition according to claim 1, wherein said photoinitiator is selected from the group of Irgacure 369 and Vicure 10.

35. The composition according to claim 34, wherein said photoinitiator is Irgacure 369.

36. The composition according to claim 1, wherein said organic carrier is at least one selected from the group of methanol, methyl ethyl ketone and ethanol.

37. The composition according to claim 36, wherein said organic carrier comprises methanol and methyl ethyl ketone.

38. The ink of claim 1 also comprising a colorant.

39. The ink of claim 38 wherein the colorant is present in an amount from about 0.5% to 4%.

40. The ink of claim 39 wherein the colorant is selected from the group consisting of Morfast black A, Morfast black 101, Morfast red 102, Morfast yellow 102, Hektoblack X-21, Milliken blue A45-1, Milliken red A45-2 and Milliken yellow A45-3.

41. An ink composition for use in ink jet printing comprising Biphenol A epoxy diacrylate, aromatic monofunctional acrylate, nonyl phenol ethoxylate monoacrylate, Bisphenol A ethoxylate diacrylate, trimethylol propane propoxylate triacrylate, ethoxylated neopentyl glycol diacrylate, trimethylol propane triacrylate, 2-benzyl-2-N,N-dimethylamino-1-(4-morpholinophenyl)-1-butanone, methanol, methyl ethyl ketone, lithium nitrate, a fluorinated alkyl ester, 2-isopropylthioxanthone, and p-methoxyphenol.

* * * * *